(12) United States Patent
Buller et al.

(10) Patent No.: US 9,153,730 B2
(45) Date of Patent: Oct. 6, 2015

(54) SOLAR CELL FRONT CONTACT DOPING

(75) Inventors: Benyamin Buller, Sylvania, OH (US);
Markus Gloeckler, Perrysburg, OH (US); Rui Shao, Sylvania, OH (US)

(73) Assignee: First Solar, Inc., Perrysburg, OH (US)

( * ) Notice: Subject to any disclaimer, the term of this patent is extended or adjusted under 35 U.S.C. 154(b) by 725 days.

(21) Appl. No.: 12/834,510

(22) Filed: Jul. 12, 2010

(65) Prior Publication Data

US 2011/0005591 A1  Jan. 13, 2011

Related U.S. Application Data

(60) Provisional application No. 61/224,941, filed on Jul. 13, 2009.

(51) Int. Cl.
*H01L 31/00* (2006.01)
*H01L 31/18* (2006.01)
*H01L 31/0296* (2006.01)
*H01L 31/032* (2006.01)
*H01L 31/073* (2012.01)

(52) U.S. Cl.
CPC ...... *H01L 31/1884* (2013.01); *H01L 31/02966* (2013.01); *H01L 31/0324* (2013.01); *H01L 31/073* (2013.01); *Y02E 10/543* (2013.01)

(58) Field of Classification Search
CPC .................. H01L 31/02966; H01L 31/0324; H01L 31/1884; H01L 31/073; Y02E 10/543
USPC ........................... 136/243–265; 257/E31.126
See application file for complete search history.

(56) References Cited

U.S. PATENT DOCUMENTS

| | | | |
|---|---|---|---|
| 3,496,024 A | | 2/1970 | Ruehrwein |
| 5,304,499 A | * | 4/1994 | Bonnet et al. .................. 438/94 |
| 5,922,142 A | * | 7/1999 | Wu et al. ...................... 136/260 |
| 6,221,495 B1 | * | 4/2001 | Wu et al. ...................... 428/432 |
| 8,298,856 B2 | * | 10/2012 | Garnett .......................... 438/84 |
| 8,541,792 B2 | * | 9/2013 | Thomsen ........................ 257/88 |
| 2008/0105298 A1 | * | 5/2008 | Lu et al. ........................ 136/256 |
| 2008/0115827 A1 | | 5/2008 | Woods et al. |
| 2008/0302414 A1 | | 12/2008 | Den Boer et al. |
| 2009/0014065 A1 | | 1/2009 | Mueller et al. |
| 2009/0020149 A1 | | 1/2009 | Woods et al. |
| 2009/0242029 A1 | | 10/2009 | Paulson et al. |
| 2009/0314337 A1 | | 12/2009 | Lee et al. |
| 2009/0320916 A1 | * | 12/2009 | Yuan et al. .................... 136/256 |
| 2010/0051105 A1 | | 3/2010 | Pinarbasi |

FOREIGN PATENT DOCUMENTS

CN      1842920 A      10/2006
(Continued)

OTHER PUBLICATIONS

Chu, Ting L., Chu, Shirley S., Recent progress in thin-film cadmium telluride solar cells, 1993, Progress in Photovoltaics: Research and Applications, vol. 1, 31-42.*

(Continued)

*Primary Examiner* — Tamir Ayad
(74) *Attorney, Agent, or Firm* — Dickstein Shapiro LLP

(57) ABSTRACT

A method of doping solar cell front contact can improve the efficiency of CdTe-based or other kinds of solar cells.

11 Claims, 8 Drawing Sheets

(56) References Cited

FOREIGN PATENT DOCUMENTS

| CN | 201156545 Y | 11/2008 |
|---|---|---|
| EP | 1 705 717 A1 | 9/2006 |
| JP | 2005-505938 A | 2/2005 |
| JP | 2008-088382 A | 4/2008 |
| JP | 2009-74210 A | 4/2009 |
| WO | WO 03/032406 A2 | 4/2003 |
| WO | WO 2007/129097 | 11/2007 |
| WO | WO 2009/058985 | 5/2009 |

OTHER PUBLICATIONS

P. K. Manoj, Benny Joseph, V.K. Vaidyan, D. Sumangala Devi Amma, Preparation and Characterization of indium-doped tin oxide thin films, Ceramics International, vol. 33, Issue 2, Mar. 2007, pp. 273-278.*

Podesta, A. et al., "Influence of the fluorine doping on the optical properties of CdS thin films for photovoltaic applications", Jan. 2006, Thin Solid Films, DOI: 10.1016/j.tsf.2005.11.069, abstract.*

* cited by examiner

SOLAR CELL FRONT CONTACT DOPING

CLAIM OF PRIORITY

This application claims priority to U.S. Provisional Patent Application No. 61/224,941, filed on Jul. 13, 2009, which is incorporated by reference in its entirety.

TECHNICAL FIELD

This invention relates to a solar cell with a doped front contact.

BACKGROUND

Photovoltaic devices can use transparent thin films that are also conductors of electrical charge. The conductive thin films can include transparent conductive layers that contain a transparent conductive oxide (TCO), such as tin oxide or zinc oxide. The TCO can allow light to pass through a semiconductor window layer to the active light absorbing material and also serve as an ohmic contact to transport photogenerated charge carriers away from the light absorbing material.

DETAILED DESCRIPTION

Figure 1:
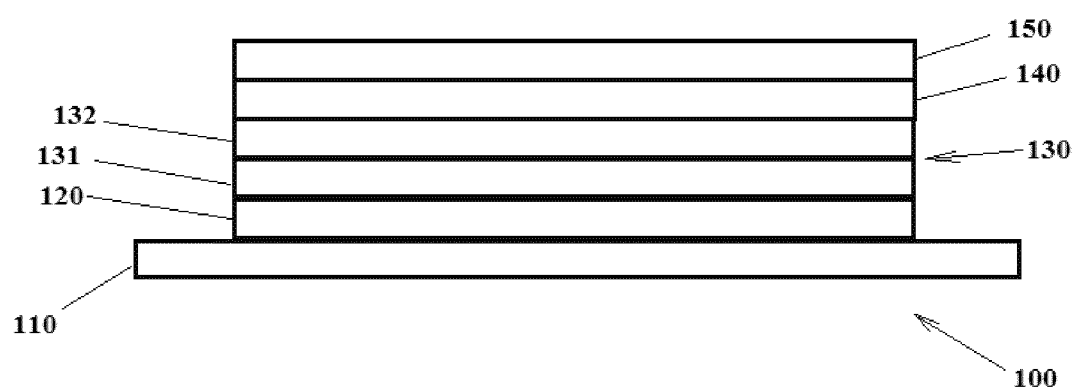
FIG. 1 is a schematic of a photovoltaic device having multiple semiconductor layers and a metal back contact.

During the fabrication of photovoltaic devices, layers of semiconductor material can be deposited on a substrate including a front contact and an absorber layer. The front contact can include a semiconductor window layer allowing the penetration of solar radiation to the absorber layer, where the optical power is converted into electrical power. Some photovoltaic devices can use transparent thin films that are also conductors of electrical charge. The front contact can also include transparent conductive layers that contain a transparent conductive oxide (TCO), such as cadmium stannate. The TCO can allow light to pass through a semiconductor window layer to the active light absorbing material and also serve as an ohmic contact to transport photo-generated charge carriers away from the light absorbing material. In certain embodiments, the front contact can also include the layers positioned between the TCO and the absorber layer.

For thin film solar cells, the transparent conductive oxide (TCO) material can influence device performance. TCO layers with high electrical conductivity can be desirable. For a TCO layer made of zinc oxide or tin oxide, its thickness can be increased to lower the sheet resistance. In practice, the thick TCO layer can result in cost increase, peeling and adhesion problems, and manufacturing difficulties. Methods of making doped TCO layer are developed to reduce the sheet resistance of solar cell front contacts without increasing their thickness.

In one aspect, a photovoltaic device can include a substrate, a front contact layer adjacent to the substrate, wherein the front contact layer is doped by a dopant, and a semiconductor absorber layer adjacent to the doped front contact layer, wherein the semiconductor absorber layer can include cadmium telluride. The front contact layer can include a transparent conductive oxide layer adjacent to the substrate and a buffer layer adjacent to the transparent conductive oxide layer. The front contact layer can further include a semiconductor window layer adjacent to the buffer layer. The transparent conductive oxide layer can include a zinc oxide. The transparent conductive oxide layer can include a tin oxide. The dopant can include an N-type dopant. The dopant can include at least one element selected from the group consisting of aluminum, indium, boron, copper, chlorine, gallium, fluorine, and magnesium. The substrate can include glass. The buffer layer can include at least one component selected from the group consisting of zinc telluride, cadmium zinc telluride, and cadmium sulfide. The window layer can include an $M_{1-x}G_xO_y$ semiconductor, the M is selected from the group consisting of zinc and tin, and the G is selected from the group consisting of aluminum, silicon, and zirconium, or at least one component selected from the group consisting of cadmium sulfide, zinc telluride, cadmium zinc sulfide, zinc oxide, zinc sulfide, zinc magnesium oxide, cadmium magnesium sulfide, zinc aluminum oxide, zinc silicon oxide, zinc zirconium oxide, tin aluminum oxide, tin silicon oxide, tin zirconium oxide, and cadmium oxide.

In another aspect, a method of manufacturing a photovoltaic device can include depositing a transparent conductive oxide layer adjacent to a substrate. After the deposition, the transparent conductive oxide layer has a surface. The method can include exposing the surface of the transparent conductive oxide layer to a dopant, wherein a dopant layer can be left on the surface, depositing a window layer adjacent to the dopant layer, incorporating the dopant into the window layer, and depositing an absorber layer adjacent to the window layer. The absorber layer can include cadmium telluride. Depositing the window layer can include a sputtering process. Exposing the surface of the transparent conductive oxide layer can include washing the surface with a salt of the dopant. The salt can include a boric-acid salt. The dopant can include an N-type dopant. The dopant can include at least one element selected from the group consisting of aluminum, indium, boron, copper, chlorine, gallium, fluorine, and magnesium.

The window layer can include at least one component selected from the group consisting of cadmium sulfide, zinc telluride, cadmium zinc sulfide, zinc oxide, zinc sulfide, zinc magnesium oxide, cadmium magnesium sulfide, and cadmium oxide. The window layer can include an $M_{1-x}G_xO_y$ semiconductor, the M can be selected from the group consisting of zinc and tin, and the G can be selected from the group consisting of aluminum, silicon, and zirconium. Depositing the window layer can include a vapor transport deposition process. Depositing the window layer can include depositing a cadmium sulfide window layer adjacent to the dopant layer and depositing a zinc-containing layer on the cadmium sulfide window layer. The sputtering process can include sputtering from a ceramic target in an inert atmosphere or reactive sputtering from a metal target. The method can further include an annealing step.

In another aspect, a method of manufacturing a photovoltaic device can include depositing a transparent conductive oxide layer adjacent to a substrate, depositing a window layer adjacent to the transparent conductive oxide layer by sputtering from a doped target, and depositing an absorber layer adjacent to the window layer. The doped target can be doped by a dopant. The absorber layer can include cadmium telluride. The method can include depositing a precursor layer adjacent to the transparent conductive oxide layer by sputtering from a doped target, depositing a buffer layer adjacent to a precursor layer, and annealing the precursor layer and the buffer layer to form a doped buffer layer.

A photovoltaic device can include a transparent conductive oxide layer adjacent to a substrate and layers of semiconductor material. The layers of semiconductor material can include a bi-layer, which may include an n-type semiconductor window layer, and a p-type semiconductor absorber layer. Photons can free electron-hole pairs upon making contact with the n-type window layer, sending electrons to the n side and holes to the p side. Electrons can flow back to the p side via an external current path. The resulting electron flow provides current which, combined with the resulting voltage from the electric field, creates power. The result is the conversion of photon energy into electric power.

Referring to FIG. 1, a photovoltaic device 100 can include a doped transparent conductive oxide layer 120 deposited adjacent to a substrate 110. Transparent conductive oxide layer 120 can be deposited on substrate 110 by sputtering, chemical vapor deposition, or any other suitable deposition method. Substrate 110 can include a glass, such as soda-lime glass. Transparent conductive oxide layer 120 can include any suitable transparent conductive oxide material, including a cadmium stannate, an indium-doped cadmium oxide, or a tin-doped indium oxide. A semiconductor bi-layer 130 can be formed or deposited adjacent to transparent conductive oxide layer 120 which can be annealed. Semiconductor bi-layer 130 can include semiconductor window layer 131 and semiconductor absorber layer 132. Semiconductor window layer 131 of semiconductor bi-layer 130 can be deposited adjacent to transparent conductive oxide layer 120. Semiconductor window layer 131 can include any suitable window material, such as cadmium sulfide, and can be deposited by any suitable deposition method, such as sputtering or vapor transport deposition. Semiconductor absorber layer 132 can be deposited adjacent to semiconductor window layer 131. Semiconductor absorber layer 132 can be deposited on semiconductor window layer 131. Semiconductor absorber layer 132 can be any suitable absorber material, such as cadmium telluride, and can be deposited by any suitable method, such as sputtering or vapor transport deposition. Back contact 140 can be deposited adjacent to semiconductor absorber layer 132. Back contact 140 can be deposited adjacent to semiconductor bi-layer 130. A back support 150 can be positioned adjacent to back contact 140. A photovoltaic device can have a Cadmium Sulfide (CdS) layer as a semiconductor window layer and a Cadmium Telluride (CdTe) layer as a semiconductor absorber layer.

An alternative configuration of photovoltaic devices consists essentially of three semiconductor materials and will be referred to as a "p-i-n device". The "i" stands for "intrinsic" and refers to a semiconductor material that in equilibrium has a relatively low number of charge carriers or either charge type or in which the net number of carriers, where "net" would be the absolute value of the concentration of p-type charge carriers minus the concentration on n-type carriers, can be less than about $5 \times 10^{14}$ cm$^{-3}$, wherein $2 \times 10^{15}$ cm$^{-3}$ is the upper limit for a p-i-n device. Typically the primary function of the "i" layer is to absorb optical photons and convert them to electron-hole pairs. The photogenerated electrons and holes move within the "i" layer as driven by drift and diffusion until they either "recombine" with each other within the i-layer or at the p-i interface or at the i-n interface or until they are collected by the n and p layers, respectively.

Figure 2:
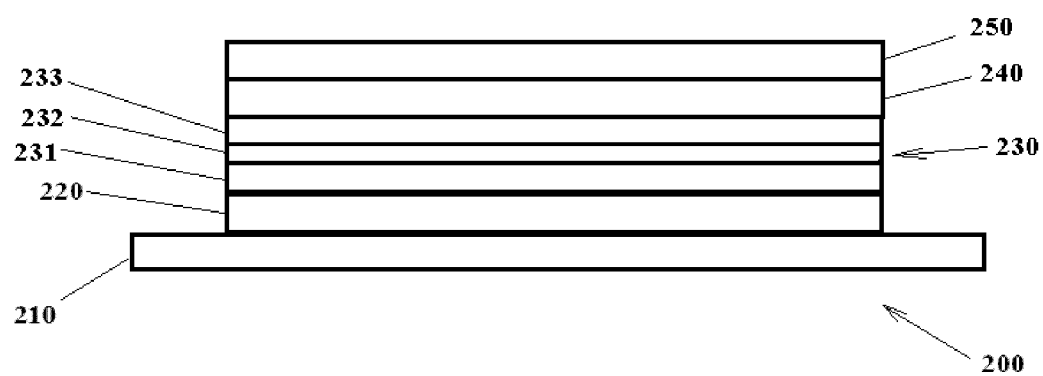
FIG. 2 is a schematic of a photovoltaic device having multiple semiconductor layers and a metal back contact.

Referring to FIG. 2, a photovoltaic device 200 can include a transparent conductive oxide layer 220 deposited adjacent to a substrate 210. Transparent conductive oxide layer 220 can be deposited on substrate 210 by sputtering, chemical vapor deposition, or any other suitable deposition method.

A sputtering target can be manufactured by ingot metallurgy. A sputtering target can include one or more components of a layer or film to be deposited or otherwise formed on a surface, such as a substrate. For example, a sputtering target can include one or more components of a TCO layer to be deposited on a substrate, such as zinc for a zinc oxide TCO layer, tin for a tin oxide TCO layer, or a dopant such as an N-type dopant or P-type dopant, such as aluminum, indium, boron, chlorine, copper, gallium, or fluorine. The sputtering target can include one or more components of a window layer to be deposited, such as cadmium for a cadmium sulfide window layer, zinc for a zinc oxide window layer, or a dopant such as an N-type dopant or P-type dopant, such as aluminum, indium, boron, chlorine, copper, gallium, fluorine, or magnesium. The components can be present in the target in stoichiometrically proper amounts. A sputtering target can be manufactured as a single piece in any suitable shape. A sputtering target can be a tube. A sputtering target can be manufactured by casting a metallic material into any suitable shape, such as a tube.

A sputtering target can be manufactured from more than one piece. A sputtering target can be manufactured from more than one piece of metal, for example, a piece of zinc for a zinc oxide TCO and a piece of dopant material, such as aluminum. The components can be formed in any suitable shape, such as sleeves, and can be joined or connected in any suitable manner or configuration. For example, a piece of zinc and a piece of aluminum can be welded together to form the sputtering target. One sleeve can be positioned within another sleeve.

A sputtering target can be manufactured by powder metallurgy. A sputtering target can be formed by consolidating metallic powder to form the target. The metallic powder can be consolidated in any suitable process (e.g., pressing such as isostatic pressing) and in any suitable shape. The consolidating can occur at any suitable temperature. A sputtering target can be formed from metallic powder including more than one metal powder. More than one metallic powder can be present in stoichiometrically proper amounts.

A sputter target can be manufactured by positioning wire including target material adjacent to a base. For example wire including target material can be wrapped around a base tube. The wire can include multiple metals present in stoichiometrically proper amounts. The base tube can be formed from a material that will not be sputtered. The wire can be pressed (e.g., by isostatic pressing).

A sputter target can be manufactured by spraying a target material onto a base. Metallic target material can be sprayed by any suitable spraying process, including thermal spraying and plasma spraying. The metallic target material can include multiple metals, present in stoichiometrically proper amounts. The base onto which the metallic target material is sprayed can be a tube.

Substrate 210 can include a glass, such as soda-lime glass. Transparent conductive oxide layer 220 can include any suitable transparent conductive oxide material, including a cadmium stannate, an indium-doped cadmium oxide, or a tin-doped indium oxide. A semiconductor tri-layer structure 230 can be formed or deposited adjacent to annealed transparent conductive oxide layer 220. Semiconductor tri-layer structure 230 can include first semiconductor layer 231, semiconductor interfacial layer 232, and second semiconductor layer 233. First semiconductor window layer 231 of semiconductor tri-layer structure 230 can be deposited adjacent to annealed transparent conductive oxide layer 220. First semiconductor window layer 231 can include any suitable window material, such as cadmium sulfide, and can be formed by any suitable deposition method, such as sputtering or vapor transport deposition. Semiconductor interfacial layer 232 can be deposited adjacent to first semiconductor layer 231. Semiconductor interfacial layer 232 can be any suitable semiconductor material, such as zinc telluride, and can be deposited by any suitable method, such as sputtering or vapor transport deposition. Second semiconductor layer 233 can be deposited on semiconductor interfacial layer 232. Second semiconductor layer 233 can be any suitable semiconductor material, such as cadmium telluride, and can be deposited by any suitable method, such as sputtering or vapor transport deposition. Back contact 240 can be deposited adjacent to second semiconductor layer 233. Back contact 240 can be deposited adjacent to semiconductor tri-layer structure 230. A back support 250 can be positioned adjacent to back contact 240.

TCO layers with high optical transmission, high electrical conductivity and good light scattering properties are always desirable. A TCO layer can have a sheet resistance about 5 ohm per square or even lower. For a TCO layer made of pure zinc oxide or tin oxide, its thickness sheet resistance can be lowered (for example to about 5 ohms per square) by increasing layer thickness. In practice, the thick TCO layer can result in cost increase. Cracks can also appear in thick TCO films, leading to peeling and adhesion problems. Furthermore, very thick TCO films can create supplementary difficulties while patterning the TCO during the production step of series connection for module production.

A TCO layer can be doped to reduce the sheet resistance of solar cell front contacts without increasing their thickness. Methods of making doped TCO layer can include a sputter process from a doped target.

A doped window layer can be deposited using a similar process. In certain embodiments, a method of manufacturing a photovoltaic device with doped window layer can include the steps of depositing a transparent conductive oxide layer adjacent to a substrate, depositing a window layer adjacent to the transparent conductive oxide layer by sputtering from a doped target, and depositing an absorber layer adjacent to the window layer, wherein the absorber layer can include cadmium telluride.

The deposition of the window layer can further include the steps of depositing a cadmium sulfide window layer adjacent to the dopant layer and depositing a zinc-containing layer on the cadmium sulfide window layer.

In certain embodiments, the sputtering process of doped TCO or doped window layer can include sputtering from a ceramic target in an inert atmosphere or reactive sputtering from a metal target.

Figure 3:
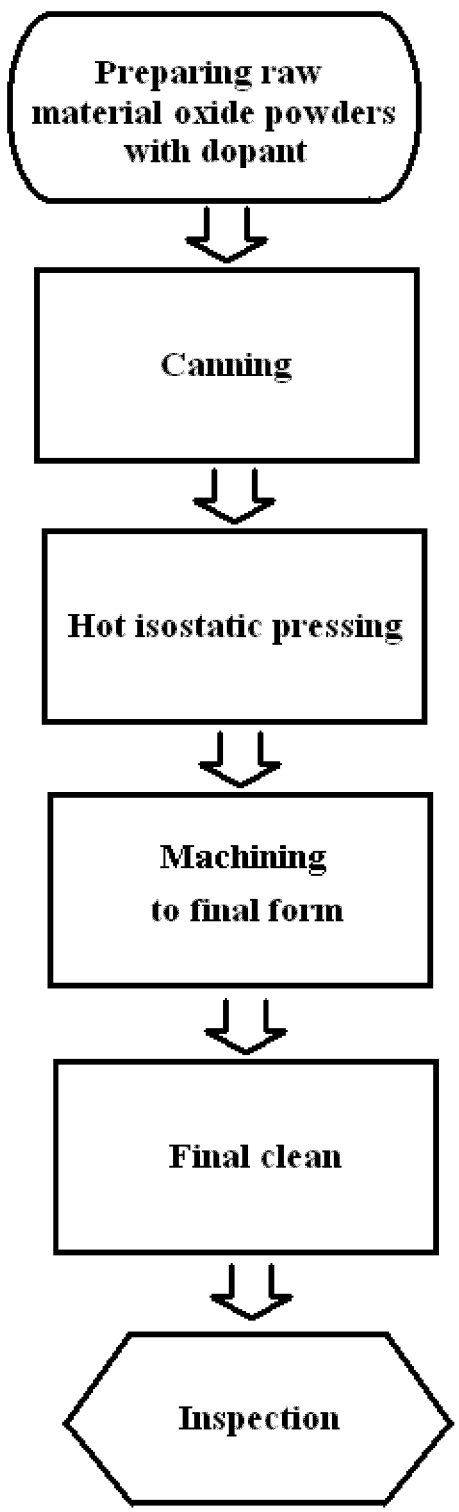
FIG. 3 is a process flow chart of making a doped sputter target.

Referring to FIG. 3, making a doped sputter target can include the steps of preparing raw material oxide powders with at least one dopant, canning the powders, hot isostatic pressing the powders with at least one dopant, machining to final form, final clean, and inspection. Making a doped sputter target can further include annealing or any other suitable metallurgy technique or other treatment. The doped sputter target can include an oxide such as tin oxide or tin oxide with at least one dopant such as boron, sodium, fluorine, or aluminum.

Figure 4:
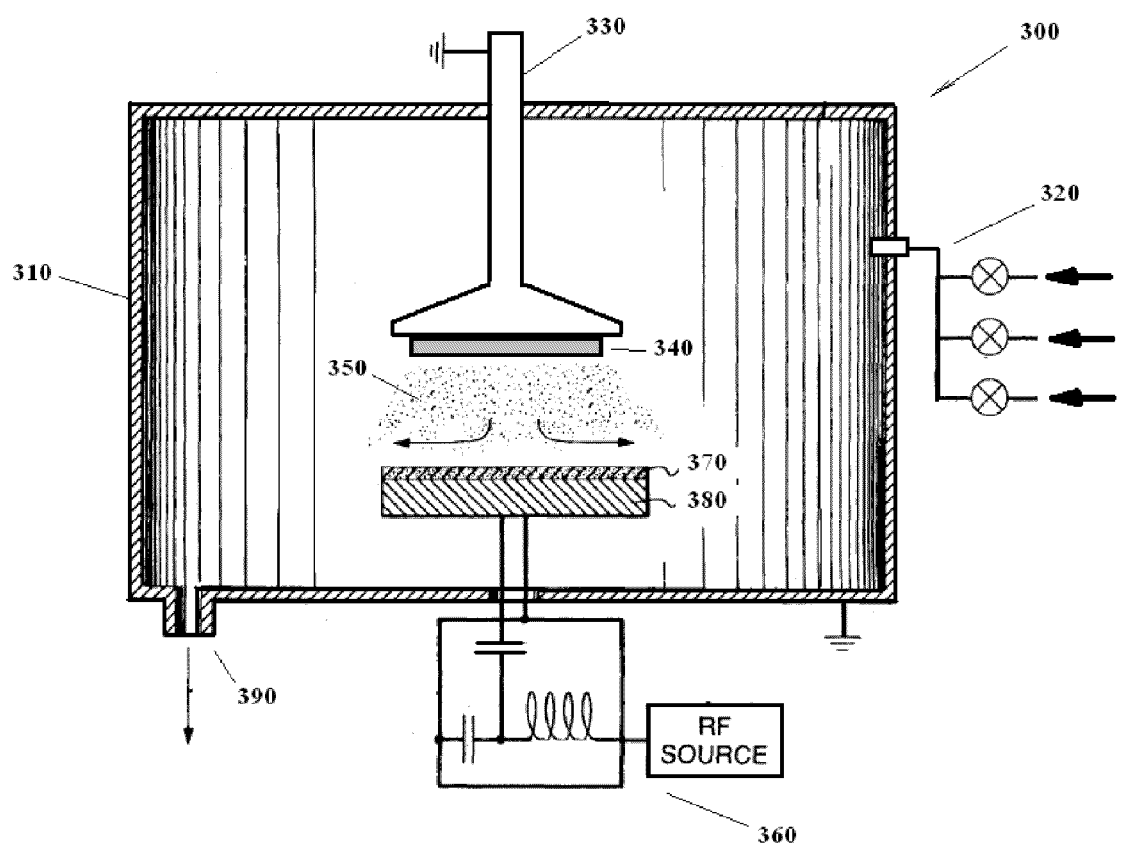
FIG. 4 is a schematic showing the sputtering deposition process of a front contact layer.

Referring to FIG. 4, front contact sputter system 300 can include chamber 310 and radio-frequency source and matching circuit 360. Substrate 370 can be mounted on plate 380 or positioned in any other suitable manner. Grounded fixture 330 can hold doped sputter target 340 facing down. The gas in chamber 310 is taken from inlet 320 with sources of different gas. The gas in chamber 310 can include argon. During sputtering process, particles 350 can be deposited from target 340 to substrate 370. The sputtering process can be a reactive sputtering process. The gas in chamber 310 can further include dopant gas containing boron, sodium, fluorine, or aluminum. System 300 can include outlet 390 to exhaust gas. In other embodiments, the sputtering process can be a DC sputtering, magnetron sputter deposition, or ion assisted deposition.

Figure 5:
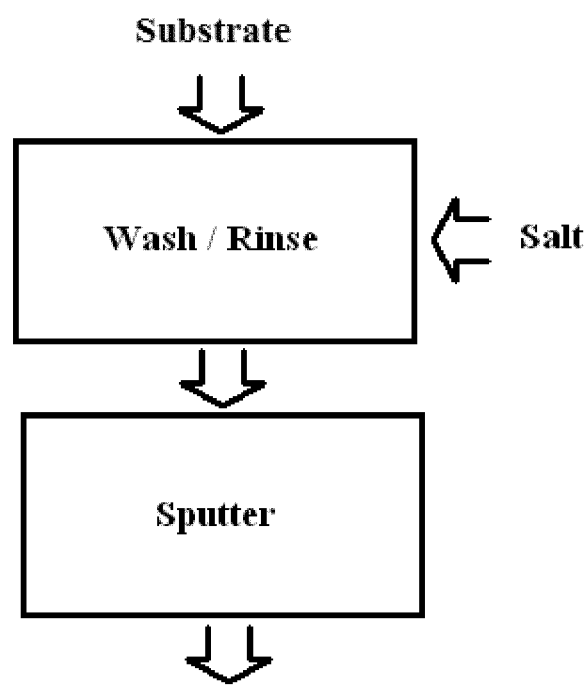
FIG. 5 is a process flow chart of deposition and processing a front contact layer including a wash/rinse step.

Referring to FIG. 5, deposition and processing a front contact layer can include the steps of substrate wash/rinse, sputter deposition, or any other suitable post-process step. During the step of substrate wash/rinse, salts can be added to process the substrate. The salts can include borax. The deposition and processing can further include any other suitable chemical bath step. The deposition and processing can further include forming a transparent conductive oxide precursor layer on the surface of the substrate for further processing.

Methods of making doped TCO layer can also include a substrate wash process. It can include the steps of washing the substrate with a dopant and depositing a doped transparent conductive oxide layer adjacent to a substrate, wherein the transparent conductive oxide layer becomes doped by the dopant. Washing a surface can include spraying, dipping, roller coating, misting, or spin coating a fluid onto the surface. The dopant can be a component of a wash fluid which can optionally include additional components. The substrate can be washed with a salt of the dopant, such as borax.

Figure 6:
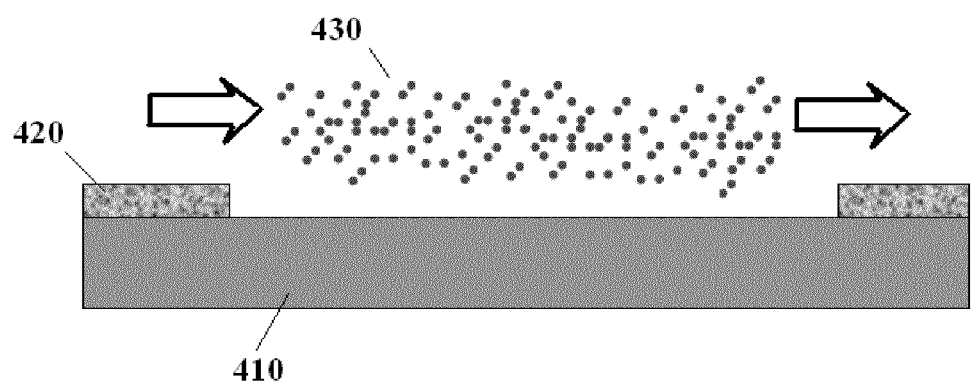
FIG. 6 is a schematic illustrating the wash/rinse doping process of a substrate.
Figure 7:
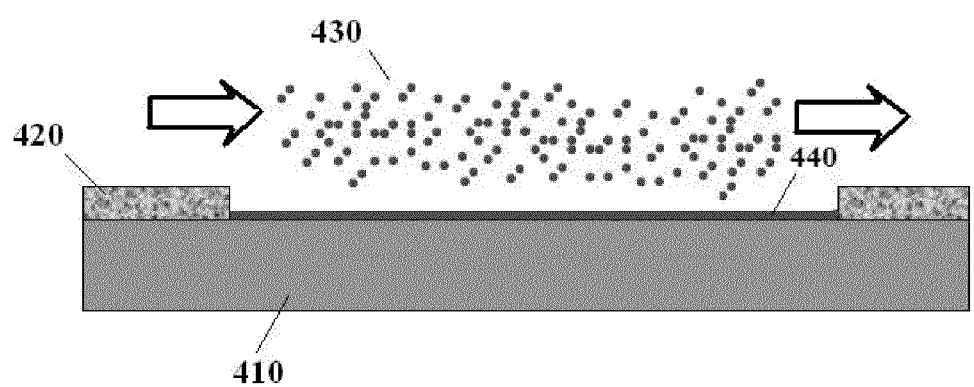
FIG. 7 is a schematic illustrating the wash/rinse doping process of a substrate.
Figure 8:
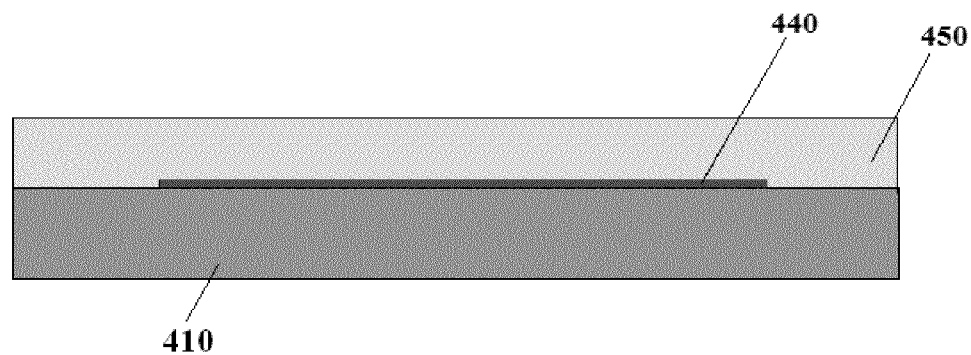
FIG. 8 is a schematic illustrating the wash/rinse doping process of a substrate.
Figure 9:
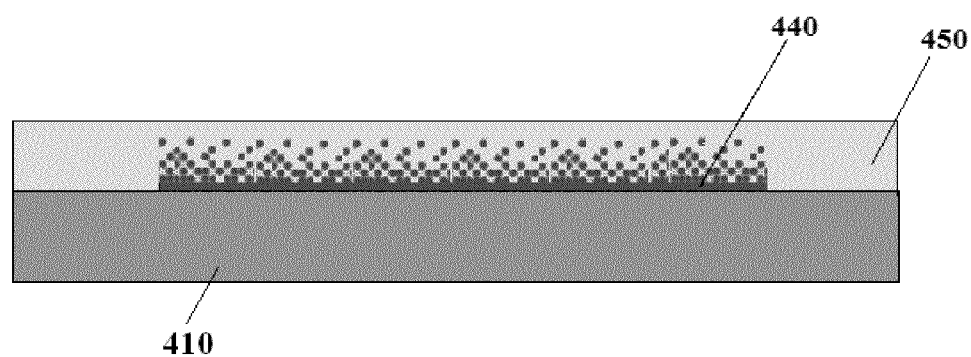
FIG. 9 is a schematic illustrating the wash/rinse doping process of a substrate.
Figure 10:
FIG. 10 is a schematic illustrating the substrate and transparent conductive oxide layer after an annealing process.

Referring to FIG. 6 through FIG. 9, a wash/rinse doping process of a substrate is illustrated. As shown in FIG. 6, substrate 410 can be washed with dopant source 430. Mask 420 can optionally be used to cover regions that do not need to be washed. Mask 420 can be photoresist or any suitable mask material. Salts can be added to dopant source 430, for example borax. As shown in FIG. 7, the wash/rinse process can leave a layer 440 including the dopant adjacent to the substrate. As shown in FIG. 8, transparent conductive oxide precursor layer 450 can be deposited adjacent to layer 440 including the dopant. Transparent conductive oxide precursor layer 450 can include zinc or tin. An additional annealing process converts the precursor layer 450 into a transparent conductive oxide layer that can include a zinc oxide or a tin oxide. Dopant atoms can diffuse into substitutional positions in the crystal lattice, resulting in desired changes in the electrical properties of the semiconductor material. As shown in FIG. 9, transparent conductive oxide precursor layer 450 can become doped by the dopant from layer 440. Transparent conductive oxide layer 450 can also become doped by the dopant left on substrate 410 by dopant source 430. Referring to FIG. 10, after annealing, substrate 410 is in contact with transparent conductive oxide layer 460 which has a doped region 451 including an N-type dopant, sodium, boron, fluorine.

The process can include a heat treatment or any suitable drive-in treatment after wash. The process can also include an additional diffusion doping process with impurity ions in gaseous form. The methods of making doped TCO layer can also include an additional step of annealing the substrate after the doped transparent conductive oxide layer is deposited.

A doped window layer can be deposited using similar process. In certain embodiments, a method of manufacturing a photovoltaic device with a doped front contact can include the steps of depositing a transparent conductive oxide layer adjacent to a substrate, exposing the surface of the transparent conductive oxide layer to a dopant, wherein a dopant layer can be left on the surface, depositing a window layer adjacent to the dopant layer, incorporating the dopant into the window layer, and depositing an absorber layer adjacent to the window layer, wherein the absorber layer comprises cadmium telluride.

In certain embodiments, a method of manufacturing a photovoltaic device with a doped front contact can include the steps of depositing a transparent conductive oxide layer adjacent to a substrate, depositing a precursor layer adjacent to the transparent conductive oxide layer by sputtering from a doped target, depositing a buffer layer adjacent to a precursor layer, annealing the precursor layer and the buffer layer to form a doped buffer layer, and depositing an absorber layer adjacent to the doped buffer layer, wherein the absorber layer comprises cadmium telluride.

In certain embodiments, the front contact layers can include the layers between the TCO layer and the semiconductor absorber layer. The front contact layers can include cadmium sulfide. The front contact layers can also have tin oxide/cadmium sulfide stack structure or any suitable modified structure based on that. The front contact layers can be deposited by reactive sputtering, vapor transport deposition, or any other suitable deposition method. The front contact layers can also be doped by a suitable dopant. The dopant can include an N-type dopant or P-type dopant, such as aluminum, indium, boron, chlorine, copper, gallium, or fluorine.

In certain embodiments, the method of manufacturing a photovoltaic device can include washing a surface of a substrate with a dopant, depositing a semiconductor window layer on the washed surface of the substrate and incorporating the dopant into the semiconductor window layer, and depositing a semiconductor absorber layer adjacent to the semiconductor window layer. The substrate can include a glass sheet and a transparent conductive oxide stack. The semiconductor window layer can include cadmium sulfide, zinc telluride, cadmium zinc sulfide, zinc oxide, zinc sulfide, or zinc magnesium oxide. Depositing the semiconductor window layer can include sputtering, vapor transport deposition, or any other suitable deposition method. Washing the substrate can further include a step of exposing the surface of the substrate with a salt of the dopant. The dopant can include an N-type dopant or P-type dopant, such as aluminum, indium, boron, chlorine, copper, gallium, or fluorine. The semiconductor absorber layer can include cadmium telluride. The transparent conductive oxide stack can include a tin oxide or zinc oxide. The resulted dopant concentration in the semiconductor window layer can be in the range from about $10^{13}$ cm$^{-3}$ to about $10^{20}$ cm$^{-3}$ or from about $10^{14}$ cm$^{-3}$ to about $10^{19}$ cm$^{-3}$.

In certain embodiments, the method of manufacturing a photovoltaic device can include depositing a semiconductor window layer adjacent to a substrate, wherein the semiconductor window layer is doped by a dopant and depositing a semiconductor absorber layer adjacent to the doped semiconductor window layer. The substrate can include a glass sheet and a transparent conductive oxide stack. The semiconductor window layer can include cadmium sulfide, zinc telluride, cadmium zinc sulfide, zinc oxide, zinc sulfide, or zinc magnesium oxide. Depositing the semiconductor window layer can include sputtering from a doped target, vapor transport deposition, or any other suitable deposition method. The dopant can include an N-type dopant or P-type dopant, such as aluminum, indium, boron, chlorine, copper, gallium, or fluorine. The semiconductor absorber layer can include cadmium telluride. The transparent conductive oxide stack can include a tin oxide. The transparent conductive oxide stack can include a zinc oxide. The resulted dopant concentration in the semiconductor window layer can be in the range from about $10^{13}$ cm$^{-3}$ to about $10^{20}$ cm$^{-3}$ or from about $10^{14}$ cm$^{-3}$ to about $10^{19}$ cm$^{-3}$.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A photovoltaic device comprising:
a substrate;
a transparent conductive oxide layer doped by a first dopant;
a buffer layer doped by a second dopant, wherein the second dopant comprises at least one element selected from the group consisting of chlorine, gallium, fluorine, and magnesium, the buffer layer comprising at least one material selected from the group consisting of zinc telluride and cadmium zinc telluride;
a semiconductor window layer doped by a third dopant, the semiconductor window layer comprising at least one material selected from the group consisting of cadmium sulfide, zinc telluride, cadmium zinc sulfide, zinc oxide, zinc sulfide, zinc aluminum oxide, zinc silicon oxide, zinc zirconium oxide, tin aluminum oxide, tin silicon oxide, tin zirconium oxide and cadmium oxide; and
a semiconductor absorber layer comprising cadmium telluride,
wherein the transparent conductive oxide layer is between the substrate and the buffer layer,
wherein the semiconductor window layer is between the buffer layer and the semiconductor absorber layer, and
wherein the first and third dopants comprise at least one element selected from the group consisting of aluminum, sodium, indium, boron, copper, chlorine, gallium, fluorine, and magnesium.

2. The photovoltaic device of claim 1, wherein the transparent conductive oxide layer comprises at least one component selected from the group consisting of zinc oxide, cadmium stannate, and tin oxide.

3. The photovoltaic device of claim 1, wherein the dopant comprises first and second dopants comprise an N-type dopant.

4. The photovoltaic device of claim 1, wherein the substrate comprises glass.

5. The photovoltaic device of claim 1, wherein the window layer comprises an $M_{1-x}G_xO_y$ semiconductor, the M is selected from the group consisting of zinc and tin, and the G is selected from the group consisting of aluminum, silicon, and zirconium, or at least one component selected from the group consisting of cadmium sulfide, zinc telluride, cadmium zinc sulfide, zinc oxide, zinc sulfide, zinc magnesium oxide, cadmium magnesium sulfide, zinc aluminum oxide, zinc silicon oxide, zinc zirconium oxide, tin aluminum oxide, tin silicon oxide, tin zirconium oxide, and cadmium oxide.

6. The photovoltaic device of claim 2, the transparent conductive oxide comprising cadmium stannate.

7. The photovoltaic device of claim 1, the semiconductor window layer comprising at least one material selected from the group consisting of cadmium sulfide and zinc oxide.

8. The photovoltaic device of claim 1, wherein the first dopant comprises at least one element selected from the group consisting of sodium, boron and fluorine.

9. The photovoltaic device of claim 1, further comprising a zinc telluride interfacial layer between the semiconductor window layer and the semiconductor absorber layer.

10. The photovoltaic device of claim 1, wherein only a region of the transparent conductive oxide layer is doped.

11. The photovoltaic device of claim 2, the transparent conductive oxide layer having a sheet resistance of about 5 ohms per square or less.

* * * * *